US012687786B2

(12) United States Patent
Noltemeyer

(10) Patent No.: US 12,687,786 B2
(45) Date of Patent: Jul. 21, 2026

(54) METHOD FOR OPERATING AN OPTICAL COMPONENT, AND OPTICAL COMPONENT

(71) Applicants: Robert Bosch GmbH, Stuttgart (DE); Carl Zeiss SMT GmbH, Oberkochen (DE)

(72) Inventor: Ralf Noltemeyer, Herrenberg (DE)

(73) Assignees: Robert Bosch GmbH, Stuttgart (DE); Carl Zeiss SMT GmbH, Oberkochen (DE)

(*) Notice: Subject to any disclaimer, the term of this patent is extended or adjusted under 35 U.S.C. 154(b) by 239 days.

(21) Appl. No.: 18/460,770

(22) Filed: Sep. 5, 2023

(65) Prior Publication Data

US 2024/0085799 A1 Mar. 14, 2024

(30) Foreign Application Priority Data

Sep. 9, 2022 (DE) .......................... 102022209396.8

(51) Int. Cl.
*G03F 7/00* (2006.01)
*G02B 26/08* (2006.01)

(52) U.S. Cl.
CPC ......... *G03F 7/702* (2013.01); *G02B 26/0841* (2013.01)

(58) Field of Classification Search
CPC .. G03F 7/702; G03F 7/70116; G02B 26/0841
See application file for complete search history.

(56) References Cited

U.S. PATENT DOCUMENTS

| | | | | |
|---|---|---|---|---|
| 8,289,599 B1 * | 10/2012 | Keithley | .............. | G02B 26/105 359/224.1 |
| 2003/0184844 A1 * | 10/2003 | Yazdi | ................. | G02B 26/0841 359/237 |
| 2004/0027632 A1 * | 2/2004 | Watson | ............... | G03F 7/70266 359/223.1 |
| 2004/0184132 A1 * | 9/2004 | Novotny | ............ | G02B 26/0841 359/290 |
| 2004/0227984 A1 * | 11/2004 | Yamabana | ......... | G02B 26/0841 359/290 |
| 2009/0244677 A1 | 10/2009 | Mizukami et al. | | |

(Continued)

FOREIGN PATENT DOCUMENTS

DE 102016213026 A1 1/2018

*Primary Examiner* — Deoram Persaud
(74) *Attorney, Agent, or Firm* — Dority & Manning, P.A.

(57) ABSTRACT

The invention relates to a method for operating an optical component having a mirror element, a substrate for carrying the mirror element, an actuator device for tilting the mirror element about one or two tilt axes, which actuator device has a first actuator electrode structure and a second actuator electrode structure, and a sensor device for detecting a tilt angle of the mirror element. The first actuator electrode structure in this case comprises a plurality of first active actuator electrodes and at least one first passive actuator electrode. The second actuator electrode structure in this case comprises a plurality of second active actuator electrodes and at least one second passive actuator electrode. At least one of the first active actuator electrodes is subjected to a first voltage and at least one of the second active actuator electrodes is subjected to a second voltage. In order to tilt the mirror element, the first and the second voltage are changed with different rates of change.

20 Claims, 3 Drawing Sheets

(56) References Cited

U.S. PATENT DOCUMENTS

| | | | | |
|---|---|---|---|---|
| 2013/0250384 | A1 | 9/2013 | Koide et al. | |
| 2015/0185469 | A1* | 7/2015 | Horn | G03F 7/70075 |
| | | | | 359/849 |
| 2016/0025964 | A1* | 1/2016 | Torayashiki | G02B 6/3586 |
| | | | | 359/221.2 |
| 2017/0199375 | A1* | 7/2017 | Naono | H10N 30/8554 |
| 2017/0363861 | A1* | 12/2017 | Hauf | G01C 9/06 |
| 2019/0195659 | A1* | 6/2019 | Ameling | G02B 19/0047 |
| 2020/0292824 | A1* | 9/2020 | Lee | G02B 27/0172 |
| 2021/0223539 | A1* | 7/2021 | Naono | G02B 26/101 |
| 2025/0199293 | A1* | 6/2025 | Noltemeyer | G03F 7/70266 |
| 2025/0231493 | A1* | 7/2025 | Noltemeyer | G03F 7/7085 |

* cited by examiner

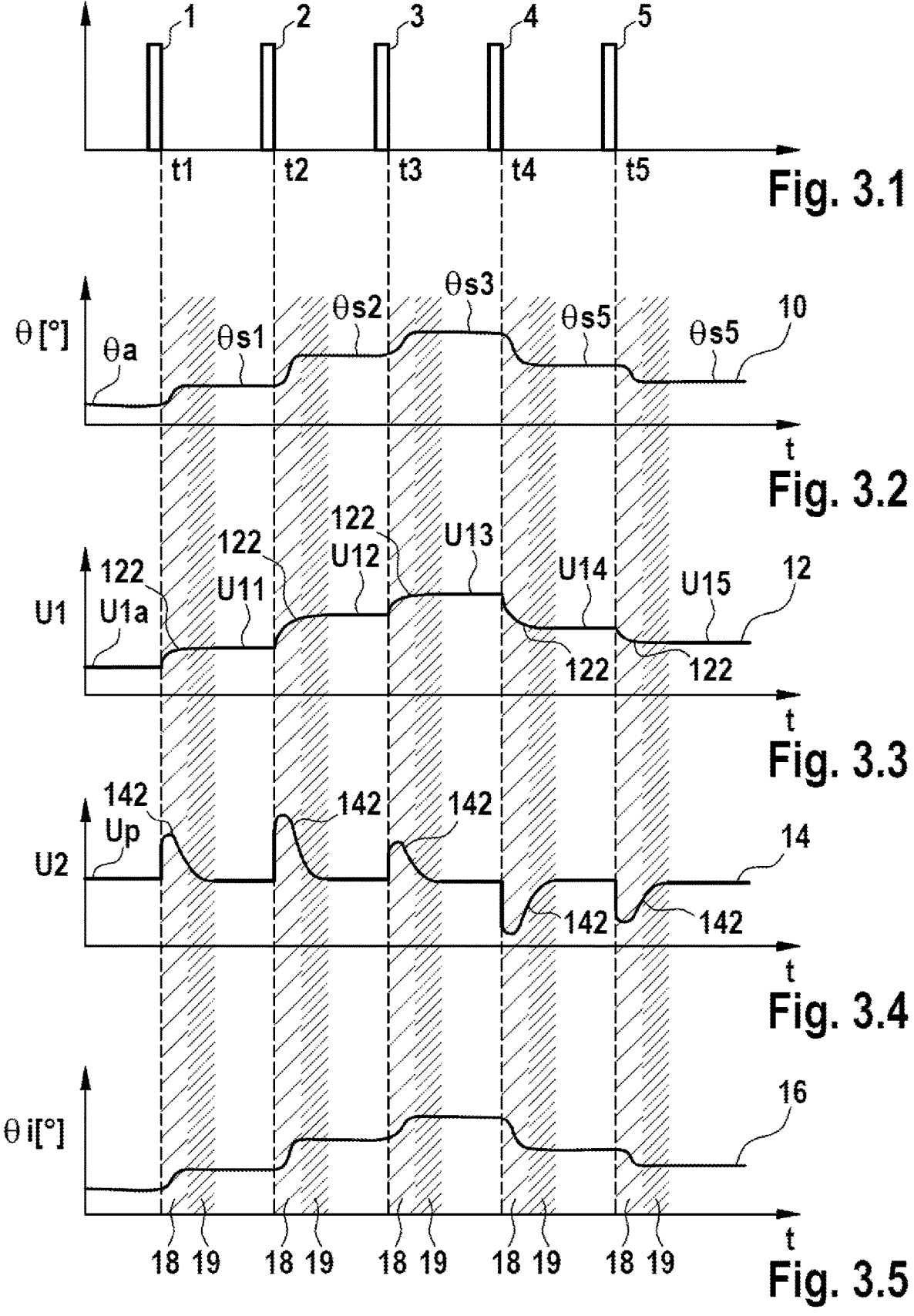
Fig. 3.1
Fig. 3.2
Fig. 3.3
Fig. 3.4
Fig. 3.5

METHOD FOR OPERATING AN OPTICAL COMPONENT, AND OPTICAL COMPONENT

PRIORITY CLAIM

The present application claims the benefit of priority of German Patent Application No. 102022209396.8, filed Sep. 9, 2022, which is incorporated herein by reference in its entirety.

A method for operating an optical component is proposed. The optical component in this case comprises a mirror element, a substrate for carrying the mirror element, an actuator device having a first actuator electrode structure and a second actuator electrode structure for tilting the mirror element, and a sensor device for detecting a tilt angle of the mirror element. The invention also relates to an optical component and to a mirror array comprising a plurality of such optical components. Moreover, the invention relates to an illumination optical unit and to an illumination system for a projection exposure apparatus, and to a projection exposure apparatus.

PRIOR ART

Depending on the application, micromirrors may be used in different applications, such as for example smartphone projectors, head-up displays, barcode readers, etc.

For EUV lithography systems, adjustable optical paths up to the reticle, also called a mask, which are able to be implemented by a micromirror array in the optical path, are advantageous.

The micromirrors may be provided with a Bragg coating that reflects the central wavelengths well. Wavelengths outside the reflection range are absorbed and generate heat in the micromirror, which has to be dissipated in a targeted manner with the lowest possible temperature resistance.

The positional accuracy of the micromirror depends on how well the micromirror position sensor system works. The micromirror position sensor system depends on manufacturing tolerances, temperature stability in combination with temperature variance and long-term stability in combination with product lifetime or the times when the device has to be recalibrated.

Document DE 10 2015 204 874 A1 relates to an actuator device for tilting a mirror element.

Document DE 10 2016 213 026 A1 relates to a sensor device for detecting a tilt angle of a mirror element.

The two documents each describe an optical component that comprises an actuator device for tilting a mirror element with two tilting degrees of freedom and a sensor device for detecting a tilt angle of the mirror element. The actuator device comprises an actuator electrode structure having actuator electrodes that are in the form of comb electrodes and form a direct drive for pivoting the mirror element. The sensor device comprises a sensor electrode structure having sensor electrodes that are likewise in the form of comb electrodes. The optical component furthermore comprises a gimbal flexure for mounting the mirror element, wherein the flexure has flexure springs and defines two tilt axes of the mirror element.

The two documents furthermore describe that the sensor electrode structure in this case comprises sensor stator electrodes that are attached to a substrate for carrying the mirror element, and sensor mirror electrodes that are attached to the mirror element. To compute the tilt angle of the mirror element, the sensor mirror electrodes are configured to bring about variable shielding of an electric field in the region of the sensor stator electrodes on the basis of the detected tilt angle of the mirror element. The sensor electrode structure has a shielding electrode structure that serves to shield electrical disturbances and electrical stray fields in the edge regions of the stator electrodes and to reduce or prevent interaction between the sensor device and the actuator device.

DISCLOSURE OF THE INVENTION

A method for operating an optical component is proposed. The optical component in this case comprises a mirror element, which is in particular a micromirror element, a substrate for carrying the mirror element, an actuator device having a first actuator electrode structure and a second actuator electrode structure for tilting the mirror element, and a sensor device for detecting a tilt angle of the mirror element. In this case, a tilt angle of the mirror element corresponds to a polar angle of a spherical coordinate system. The tilt angle may in this case be azimuth-dependent.

The first actuator electrode structure in this case comprises a plurality of first active actuator electrodes, such as for example two, four, six or more, and at least one first passive actuator electrode. The second actuator electrode structure in this case comprises a plurality of second active actuator electrodes, such as for example two, four, six or more, and at least one second passive actuator electrode. The active and passive actuator electrodes are in this case configured to exert an electrostatic force so as to tilt the mirror element. Preferably, the first and second active actuator electrodes are in the form of comb electrodes. The at least one first and second passive actuator electrode are preferably likewise in the form of comb electrodes.

Active actuator electrodes should be understood here to mean the actuator electrodes that are subjected to a variable, in particular controllable, in particular regulatable actuator voltage so as to tilt the mirror element. Actuator electrodes that are subjected to a fixed, that is to say constant voltage are also referred to as passive actuator electrodes. The passive actuator electrodes may in particular be grounded or kept at a voltage of 0 V.

According to the invention, at least one of the first active actuator electrodes is subjected to a first voltage and at least one of the second active actuator electrodes is subjected to a second voltage. In this case, in order to tilt the mirror element, the first and the second voltage are changed with different rates of change.

Preferably, all of the first and second active actuator electrodes are arranged in a common plane, which is also referred to as actuator plane. Preferably, the first active actuator electrodes are each assigned to a second active actuator electrode.

Preferably, the first and the second active actuator electrodes are attached to the substrate and the at least one first and second passive actuator electrode are attached to the mirror element. In this case, the active actuator electrodes are also referred to as actuator stator electrodes, while the passive actuator electrode is also referred to as actuator mirror electrode.

Preferably, the sensor device comprises a sensor electrode structure having a plurality of active sensor electrodes, such as for example two, four, six or more, and at least one passive sensor electrode. The active sensor electrodes and the at least one passive sensor electrode are preferably in the form of comb electrodes. The active sensor electrodes in this case comprise sensor transmitter electrodes and sensor receiver electrodes that are each preferably in the form of comb electrodes. The transmitter electrodes are in this case subjected to an AC voltage so as to detect the tilt angle of the mirror element. The passive sensor electrodes may be kept at a constant voltage. In particular, the passive sensor electrodes may be grounded or kept at a voltage of 0 V. The passive sensor electrodes are preferably configured to bring about variable shielding of an electric field in the region of the active sensor electrodes on the basis of a detected tilt angle of the mirror element.

The number of active sensor electrodes may be equal to the number of first active actuator electrodes and the number of second active actuator electrodes. By way of example, a first active actuator electrode and a second active actuator electrode may each be assigned to an active sensor electrode. The number of active sensor electrodes may also be different from the number of first active actuator electrodes or the number of second active actuator electrodes. By way of example, the number of first active actuator electrodes or the number of second active actuator electrodes may be greater than the number of active sensor electrodes.

Preferably, the active sensor electrodes are attached to the substrate and the passive sensor electrodes are attached to the mirror element. In this case, the active sensor electrodes are also referred to as sensor stator electrodes, while the at least one passive sensor electrode is also referred to as sensor mirror electrode.

Preferably, the active sensor electrodes are arranged in the common plane in which the active actuator electrodes are arranged. Preferably, the active sensor electrodes are each assigned to an active actuator electrode.

The actuator device, respectively the first and the second actuator electrode structure, may in this case form a direct drive for tilting the mirror element. A direct drive should be understood here to mean a drive in which the actuator device is able to exert a force directly on the mirror to be displaced. In particular, no force transmission mechanism is required. In other words, the drive is force-transmission-mechanism-free.

The actuator device may be part of a displacement device for displacing the mirror element, or the displacement device itself. The sensor device may likewise be part of the displacement device. In other words, the sensor electrode structure is integrated into the actuator electrode structure.

The actuator device may be configured to tilt the mirror element with a single tilting degree of freedom. The mirror element is in this case tilted about a tilt axis. The tilt axis makes it possible to divide the common plane into two sectors. The actuator and sensor electrodes are in this case arranged symmetrically about the tilt axis. When carrying out the method according to the invention in this case, for example, at least one of the first active actuator electrodes in a first sector may be subjected to a first voltage and at least one of the second active actuator electrodes in the first sector may be subjected to a second voltage. In this case, in order to tilt the mirror element, the first and the second voltage are changed with different rates of change.

Preferably, the actuator device is configured to tilt the mirror element with two tilting degrees of freedom. In this case, the mirror element may be tilted about two tilt axes simultaneously or in temporal succession. In this case, the two tilt axes make it possible to divide the common plane into four sectors, also referred to as quadrant. The actuator and sensor electrode structure may in this case exhibit radial symmetry. In other words, the actuator or sensor electrodes may in this case be arranged symmetrically about a centre point, which is also referred to as tilt point of the mirror element. Such a design makes it possible to improve the displacement of the mirror element. Below, a displacement should be understood to mean, in general, a displacement in view of a specific degree of freedom. In particular, the displacement may be pivoting, which is also referred to as tilting. In principle, the displacement may also comprise linear displacements and/or twisting of the mirror element in a mirror plane. The optical component may in this case comprise a gimbal flexure for mounting the mirror element, wherein the flexure has flexure springs and defines two tilt axes of the mirror element.

For details regarding an actuator device for tilting the mirror element with two tilting degrees of freedom and a sensor device for detecting the tilt angle of the mirror element, reference may be made to DE 10 2015 204 874 A1 and DE 10 2016 213 026 A1, which is hereby incorporated in full into the present application as part thereof.

When carrying out the method according to the invention in the case in which the actuator device is configured to tilt the mirror element about two tilt axes, at least one of the first active actuator electrodes in a first sector or a first quadrant may likewise be subjected to a first voltage and at least one of the second active actuator electrodes in the same sector or quadrant may be subjected to a second voltage, wherein, in order to tilt the mirror element, the first and the second voltage are changed with different rates of change. The actuator or sensor electrodes of other sectors or quadrants may also be involved in this, for example, in order to achieve an azimuth-dependent tilt angle of the mirror element. In this case, the method according to the invention should be applied accordingly or in a manner adapted to the actuator or sensor electrodes of other sectors or quadrants.

Preferably, the first voltage is changed with a first signal and the second voltage is changed with a second signal. Preferably, the first and the second signal have different signal gradients. A large signal gradient in this case indicates a large signal change per time.

Preferably, the first signal has a first signal gradient that is designed so as to avoid interference with sensor signals of the sensor device and enable a slow adjustment of a position of the mirror element. For this reason, it might be possible to do away with shieldings between the sensor electrodes and actuator electrodes that are subjected to the first voltage. The position of the mirror element should be understood to mean a tilt angle of the mirror element.

Preferably, the second signal has a second signal gradient that is designed so as for example to compensate for position changes of the mirror element that are caused by external influences, such as for example external vibrations, and enable a limited fast adjustment of the position of the mirror element.

Preferably, the second signal gradient is greater than the first signal gradient.

The target tilt angle should be reached in a first phase, in which the first signal has not yet reached its target value. This target value difference of the first signal is compensated for by the additional second signal until the first signal, in a second phase, has reached its target value. The tilt angle of the mirror element in this second phase remains constant and is maintained until a new mirror position or a new tilt angle has to be moved to.

Preferably, the first signal is regulated such that, in the steady state, the second signal is in an optimum operating state. An optimum operating state may be understood to mean for example that a symmetrical adjustment of the mirror element is the same in both directions or that a maximum effective force is achieved for a limited setting range.

The strength of the second signal for changing the second voltage may adopt a constant value. As an alternative, the strength of the second signal may be computed on the basis of a difference between a target tilt angle and a detected tilt angle.

Preferably, control electronics for carrying out the method according to the invention are provided for the optical component.

A further aspect of the invention is the provision of an optical component that is configured to carry out the method according to the invention. The optical component in this case comprises a mirror element, a substrate for carrying the mirror element, an actuator device for tilting the mirror element and a sensor device for detecting a tilt angle of the mirror element.

The method according to the invention is preferably carried out using the optical component proposed according to the invention. Accordingly, features described within the scope of the optical component apply to the method and, conversely, features described within the scope of the method apply to the optical component.

Also proposed is a mirror array that comprises a plurality of optical components according to the invention.

Furthermore proposed is an illumination optical unit for a projection exposure apparatus for guiding illumination radiation to an object field, which illumination optical unit comprises at least one mirror array according to the invention.

Also proposed is an illumination system for a projection exposure apparatus, which illumination system comprises an illumination optical unit according to the invention and a radiation source, in particular an EUV radiation source.

Additionally proposed is a microlithographic projection exposure apparatus that comprises an illumination optical unit according to the invention and a projection optical unit for projecting a reticle arranged in an object field into an image field.

For details regarding a possible projection exposure apparatus, reference may be made to DE 10 2015 204 874 A1 and DE 10 2016 213 026 A1, which is hereby incorporated in full into the present application as part thereof.

Advantages of the Invention

By virtue of the method proposed according to the invention, it is possible to do away with the shielding between the sensor device and the actuator device by the voltage of the first active actuator electrodes with low frequency components.

This makes it possible to create a regulation concept for setting the voltage of the first active actuator electrodes such that the second active actuator electrodes are operated at an optimum operating point.

It is likewise possible to create a regulation concept for setting the voltage of the second active actuator electrodes such that the tilting of the mirror element is regulated with high performance over all tilt angles.

Furthermore, the width of the actuator electrodes may be increased, and the tilting force or the tilting torque are thus increased for the same maximum voltage of the actuator device.

By virtue of the method proposed according to the invention, it is also possible to improve the temperature resistance of the spring because this may be designed to be stronger for the same maximum tilt angle.

BRIEF DESCRIPTION OF THE DRAWINGS

Embodiments of the invention are explained in more detail with reference to the drawings and the following description.

In the figures.

EMBODIMENTS OF THE INVENTION

In the following description of the embodiments of the invention, identical or similar elements are designated with the same reference signs, a repeated description of these elements in individual cases being omitted. The figures represent the subject matter of the invention only schematically.

Figure 1:
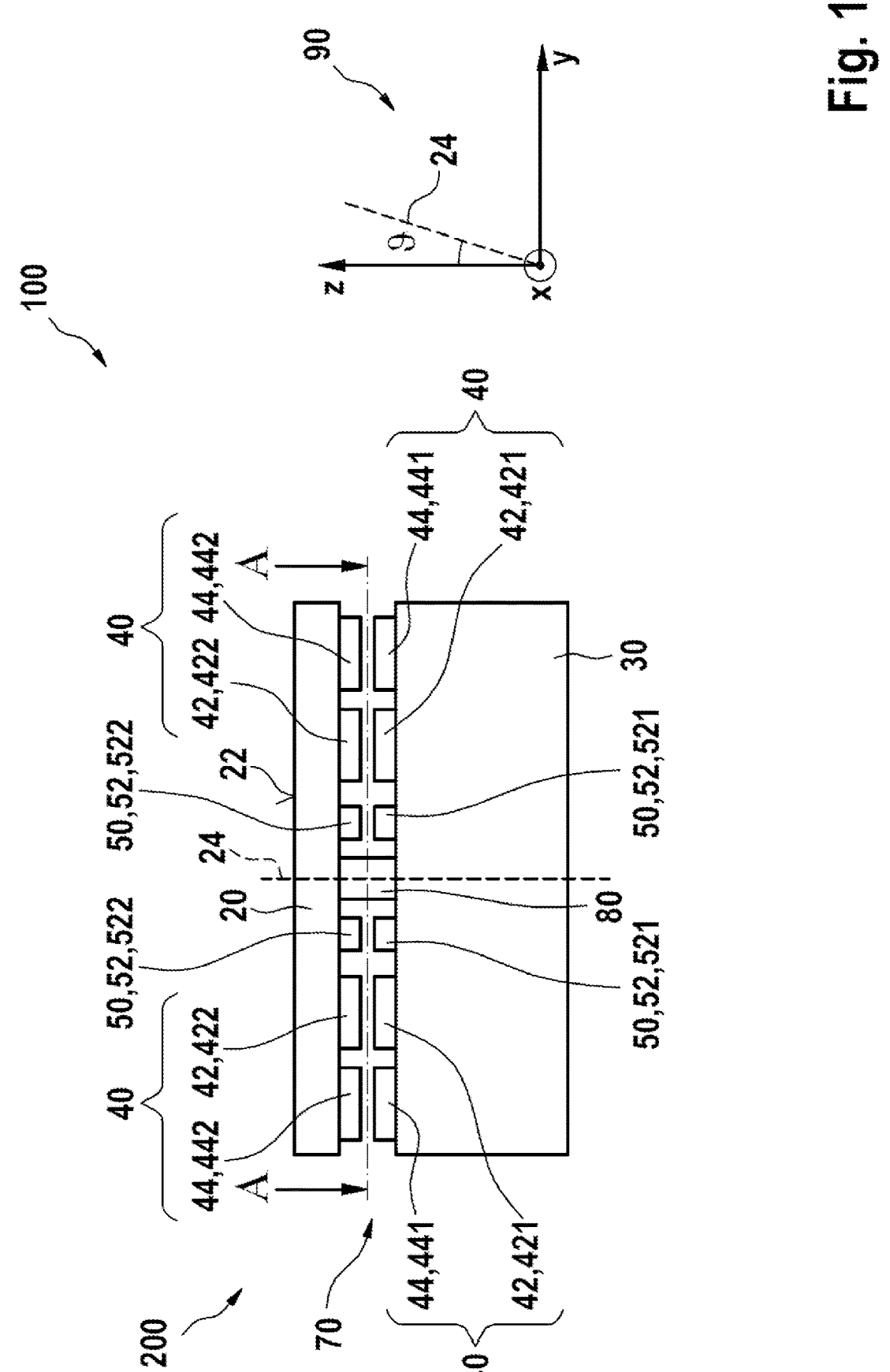
FIG. 1 shows a side view of an optical component according to the invention.

FIG. 1 depicts a side view of an optical component 100 according to the invention, which is configured to carry out the method according to the invention.

The optical component 100 in this case comprises a mirror element 20 and a substrate 30 for carrying the mirror element 20. The mirror element 20 is in this case mounted on an articulation device 80. To displace the mirror element 20, the optical component 100 comprises a displacement device 200, which has an actuator device 40 for tilting the mirror element 20 and a sensor device 50 for detecting a tilt angle θ of the mirror element 20.

The optical component 100 is arranged, for illustrative purposes, in a three-dimensional Cartesian coordinate system 90. The Cartesian three-dimensional coordinate system 90 comprises an x-axis, a y-axis and a z-axis. The x-axis runs perpendicular to the plane of the drawing towards the observer in FIG. 1. The y-axis runs to the right in FIG. 1. The z-axis runs upwards in FIG. 1.

The mirror element 20 in this case comprises a reflection surface 22 having a surface normal 24 that is perpendicular to the reflection surface 22. Here in the left-hand illustration in FIG. 1, the mirror element 20 is in an unpivoted or untilted state.

In this case, the substrate 30 is arranged on an x-y plane 92 (cf. FIG. 2), which is defined by the x-axis and the y-axis. In a tilted state, an angle is formed between the surface normal 24 and the z-axis in its running direction, which angle is defined as the tilt angle θ of the mirror element 20 and is illustrated in the right-hand illustration in FIG. 1. This angle is also referred to as polar angle in a spherical coordinate system. The mirror element 20 may in this case be tilted about the x-axis. Of course, the mirror element 20 may also be tilted about the y-axis. The mirror element 20 may likewise be tilted simultaneously about the x-axis and y-axis in order to achieve an azimuth-dependent tilt angle θ.

The actuator device 40 in this case comprises a first actuator electrode structure 42 having two first active actuator electrodes 421 (cf. FIG. 2), which here are in the form of actuator stator electrodes and are attached to the substrate 30. The first actuator electrode structure 42 in this case has two first passive actuator electrodes 422 (cf. FIG. 2), which here are in the form of an actuator mirror electrode and are attached to a surface 26 of the mirror element 20 that faces away from the reflection surface 22. In FIG. 1 here, the first passive actuator electrodes 422 are each assigned to a first active actuator electrode 421. However, the first actuator electrode structure 42 may also have a single first passive actuator electrode 422 or more than two first passive actuator electrodes 422.

The actuator device 40 furthermore comprises a second actuator electrode structure 44 having two second active actuator electrodes 441, which here are in the form of actuator stator electrodes and are attached to the substrate 30. The second actuator electrode structure 42 in this case also has two second passive actuator electrodes 442, which here are in the form of actuator mirror electrodes and are attached to the surface 26 of the mirror element 20 that faces away from the reflection surface 22. In FIG. 1 here, the second passive actuator electrodes 442 are each assigned to a second active actuator electrode 441. However, the second actuator electrode structure 44 may also have a single second passive actuator electrode 442 or more than two second passive actuator electrodes 442.

The actuator electrodes 421, 422, 441, 442 are configured to exert electrostatic force. They are preferably in the form of comb electrodes. The active actuator electrodes 421, 441 and the passive actuator electrodes 422, 442 in this case each comprise multiple comb fingers. FIG. 1 reveals that all of the active actuator electrodes 421, 441 are arranged in a common plane 70, which is parallel to the x-y plane 92 and is also referred to as an actuator plane. The actuator device 40, respectively the active actuator electrodes 421, 441 and the passive actuator electrodes 422, 442, form a direct drive for tilting the mirror element 20 in FIG. 1 here.

The sensor device 50 in this case comprises a sensor electrode structure 52. It may be seen in FIG. 1 that the sensor electrode structure 52 has two active sensor electrodes 521 (cf. FIG. 2) and two passive sensor electrodes 522 (cf. FIG. 2). In this case, the active sensor electrodes 521 are in the form of sensor stator electrodes and are attached to the substrate 30. It may also be seen in FIG. 1 that the active sensor electrodes 521 are likewise arranged in the common plane 70. The passive sensor electrodes 522 are in this case in the form of sensor mirror electrodes and are attached to the surface 26 of the mirror element 20 that faces away from the reflection surface 22. The sensor electrodes 521, 522 are preferably in the form of comb electrodes. The active sensor electrodes 521 and the passive sensor electrodes 522 in this case each comprise multiple comb fingers.

FIG. 1 reveals that the articulation device 80 for mounting the mirror element 20 is arranged centrally. It may be in the form of a flexure, such as for example a gimbal flexure. This articulation device 80 defines a mechanical tilt axis 28 (see FIG. 2) of the mirror element 20. Preferably, the articulation device 80 defines two mechanical tilt axes 28 that intersect at a central point, which is also referred to as tilt point of the mirror element 20. This tilt point is located in particular on the surface normal 24 through a central point of the mirror element 20 in the untilted state.

Figure 2:
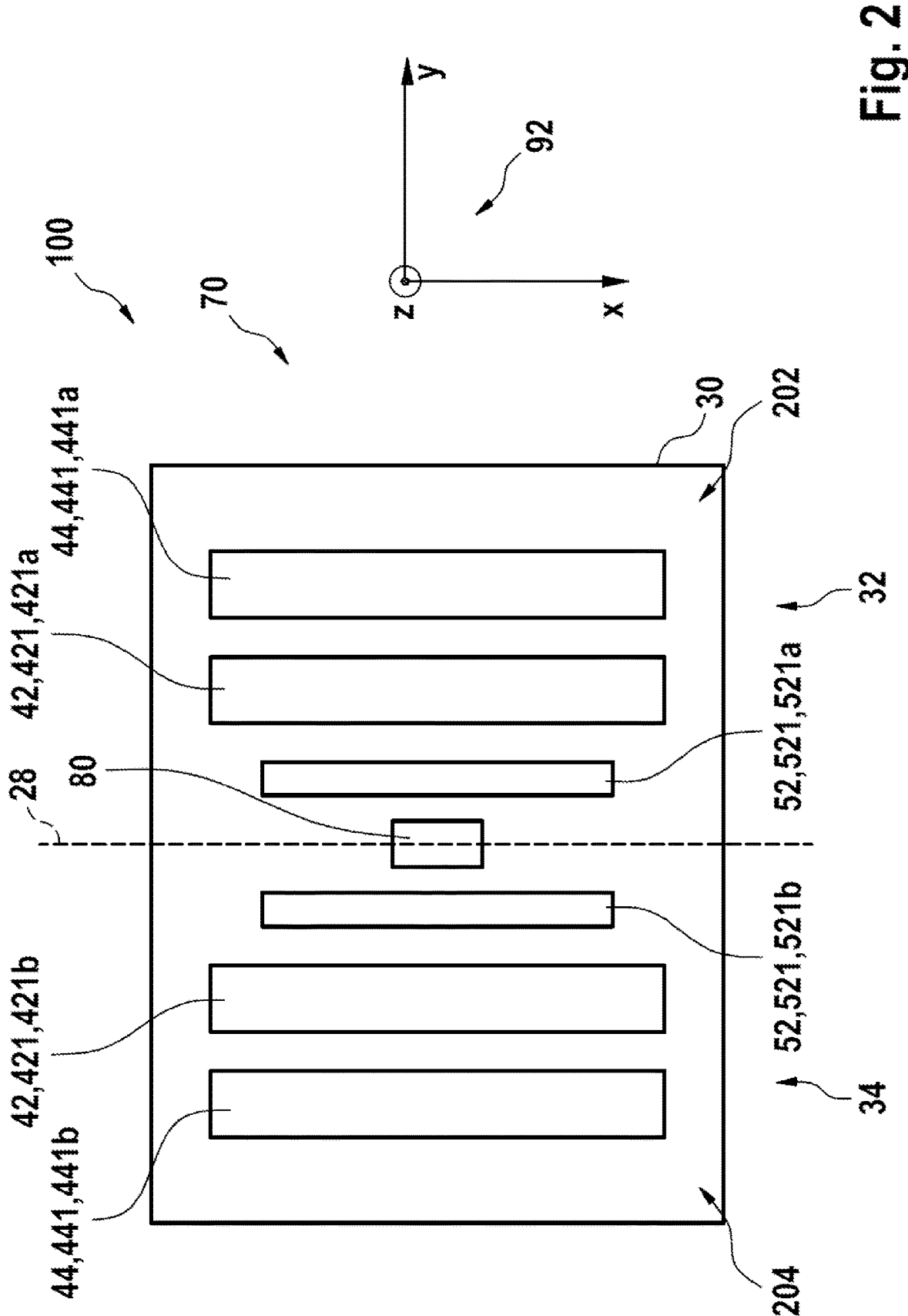
FIG. 2 shows a schematic sectional illustration of the optical component according to FIG. 1, FIG. 3.1 shows a diagram of tilt signals, FIG. 3.2 shows a temporal profile of the target tilt angle of the mirror element, FIG. 3.3 shows a temporal profile of a first voltage applied to a first active actuator electrode, FIG. 3.4 shows a temporal profile of a second voltage applied to a second active actuator electrode, and FIG. 3.5 shows a temporal profile of the detected tilt angle of the mirror element.

FIG. 2 shows a schematic sectional illustration of the optical component 100 according to FIG. 1 along a sectional plane A in order to illustrate further aspects of the actuator and sensor device 40, 50.

The optical component 100 in FIG. 2 here is arranged in the three-dimensional Cartesian coordinate system 90. The x-axis runs downwards in FIG. 2. The y-axis runs to the right in FIG. 2. The z-axis runs perpendicular to the plane of the drawing towards the observer in FIG. 2. The substrate 30 is in this case arranged on the x-y-plane 92. The common plane 70 is in this case parallel to the x-y plane 90.

As illustrated in FIG. 2, the actuator device 40 comprises a first actuator electrode structure 42 and a second actuator electrode structure 44. The first actuator electrode structure 42 in this case comprises two first active actuator electrodes 421, which are arranged on the substrate 30. The second actuator electrode structure 44 in this case comprises two second active actuator electrodes 441, which are arranged on the substrate 30.

The sensor device 50 in this case comprises a sensor electrode structure 52 having two active sensor electrodes 521, which are in the form of sensor stator electrodes and are likewise arranged on the substrate 30.

All of the active actuator and sensor electrodes 421, 441, 521 are in this case arranged in the common plane 70.

FIG. 2 reveals that the articulation device 80 defines a tilt axis 28 of the mirror element 20, which tilt axis is aligned parallel to the common plane 70 and corresponds to the x-axis. In FIG. 2 here, the common plane 70 is divided into two sectors by the tilt axis 28, specifically a first sector 32 and a second sector 34. A first active actuator electrode 421, a second active actuator electrode 441 and an active sensor electrode 521 are arranged in each sector 32, 34. Each active sensor electrode 522 is assigned a first active actuator electrode 421 and a second active actuator electrode 441 in the same sector 32, 34.

The tilt axis 28 thus divides the active actuator and sensor electrodes 421, 441, 521 into two electrode pairs, which are each arranged in a sector 32, 34. A first electrode pair 202 in this case comprises a first active actuator electrode 421a in the first sector 32, a second active actuator electrode 441a in the first sector 32 and an active sensor electrode 521a in the first sector 32, while a second electrode pair 204 comprises a first active actuator electrode 421b in the second sector 34, a second active actuator electrode 441b in the second sector 34 and an active sensor electrode 521b in the second sector 34. It may also be seen in FIG. 2 that the first and the second electrode pair 202, 204 are arranged symmetrically with respect to the tilt axis 28. The active sensor electrode 521, the first active actuator electrode 421 and the second active actuator electrode 441 are arranged going outwards, in that order, from the tilt axis 28 or the articulation device 80 in the respective sector 32, 34. A different order of the arrangement of the active actuator and sensor electrodes 421, 441, 521 is also possible.

The passive actuator and sensor electrodes 422, 442, 522 not illustrated in FIG. 2 are distributed in the same way.

During operation of the optical component 100 according to FIGS. 1 and 2 with the method according to the invention, one of the first active actuator electrodes 421 is subjected to a first voltage U1 (cf. FIG. 3.3), while the second active actuator electrode 441 in the same sector 32, 34 is subjected to a second voltage U2 (cf. FIG. 3.4). The first and the second voltage U1, U2 for tilting the mirror element 20 are in this case changed with different rates of change.

The first active actuator electrode 421a in the first sector 32 and the first active actuator electrode 421b in the second sector 34 may be controlled differentially. The second active actuator electrode 441*a* in the first sector 32 and the second active actuator electrode 441*b* in the second sector 34 may likewise be controlled differentially.

The active sensor electrode 521*a* in the first sector 32 and the active sensor electrode 521*b* in the second sector 34 may be connected differentially. They are used to determine the tilt angle relative to the tilt axis 28.

The method according to the invention is explained below with reference to FIGS. 3.1 to 3.5. Reference is made in this case to the first electrode pair 202 in the first sector 32.

To carry out the method according to the invention, provision is made, for the optical component 100, for control electronics, not illustrated, for controlling the optical component 100.

FIG. 3.1 shows a diagram of tilt signals 1 to 5, FIG. 3.2 shows a temporal profile 10 of the target tilt angle θs of the mirror element 20, FIG. 3.3 shows a temporal profile 12 of a first voltage U1 applied to the first active actuator electrode 421*a* in the first sector 32, FIG. 3.4 shows a temporal profile 14 of a second voltage U2 applied to the second actuator electrode 441*a* in the first sector 32, and FIG. 3.5 shows a temporal profile 16 of the detected tilt angle θi of the mirror element 20.

At a first time t1, the control electronics for controlling the optical component 100 receive a first tilt signal 1 by way of which they are asked to tilt the mirror element 20 from a current tilt angle θa to a first target tilt angle θs1. At the current tilt angle θa, the first voltage U1 of the first active actuator electrode 421*a* in the first sector 32 has a current value U1*a*, while the second voltage U2 of the second active actuator electrode 441*a* in the first sector 32 has an optimum value Up with regard to an optimum operating point or operating state in order to eliminate external influences or position errors.

To tilt the mirror element 20 or to reach the first target tilt angle θs1, the first voltage U1 is changed with a first signal 122 and the second voltage U2 is changed with a second signal 142. The first signal 122 is used to set the first voltage U1 to a first value U11 required to reach the first target tilt angle θs1, which first value is computed for example by the control electronics on the basis of the sensor data. The first value U11 is not yet reached within a first phase 18. The first target tilt angle θs1 is reached by the second signal 142 in this first phase 18. The target value difference from the first signal 122 is compensated for by the additional, second signal 142 until the first signal 122, in a second phase 19, has reached its target value, here the first value U11 in FIG. 3.3. The tilt angle θ of the mirror element 20 in this second phase 19 remains constant and is maintained until a new mirror position or a new tilt angle θ has to be moved to.

The strength of the second signal 142 may be dependent on the position deviation and may be computed for example by the control electronics. It may adopt a constant value if the optional operating state of the second signal is reached and no external influences necessitate a readjustment.

At a second time t2, the control electronics receive a second tilt signal 2 by way of which they are asked to tilt the mirror element 20 to a second target tilt angle θs2 that is greater than the first target tilt angle θs1.

In the same way as the process for reaching the first target tilt angle θs1, the first voltage U1 is changed with the first signal. This sets the first voltage U1 to a second value U12 required to reach the second target tilt angle θs2. At the same time, the second voltage is changed with the second signal 142. The strength of the second signal 142 here is computed on the basis of a difference between a target tilt angle θs and a detected tilt angle θi. FIG. 3.4 shows that the strength of the second signal 142 for reaching the second target tilt angle θs2 is significantly greater than the strength of the second signal for reaching the first target tilt angle θs1. The second value U12 is not yet reached within a first phase 18. The second target tilt angle θs2 is reached by the second signal 142 in this first phase 18. The target value difference from the first signal 122 in the first phase 18 is compensated for by the additional, second signal 142 until the first signal 122, in a second phase 19, has reached its target value, here the second value in FIG. 3.3. The tilt angle θ of the mirror element 20 in this second phase 19 remains constant and is maintained until a new mirror position or a new tilt angle θ has to be moved to or external influences necessitate a readjustment.

In the same way as the process for reaching the first and the second target tilt angle θs1, θs2, the first voltage U1 is set to a second value U13 required to reach the third target tilt angle θs3, which is greater than the second target tilt angle θs2, and a third target tilt angle θs3 is reached after the control electronics have received a third tilt signal 3 at a third time t3.

At a fourth time t4, the control electronics receive a fourth tilt signal 4 by way of which they are asked to tilt the mirror element 20 to a fourth target tilt angle θs4. It may be seen in FIG. 3.2 that the fourth target tilt angle θs4 is smaller than the third target tilt angle θs3. In other words, the tilt angle θ of the mirror element 20 should be reduced by changing the first voltage U1 or the second voltage U2. FIG. 3.3 reveals that the first voltage U1 is changed with a first signal 122 such that the magnitude of the voltage U1 following the change is reduced to a fourth value U14 that is required to reach the fourth target tilt angle θs4. At the same time, the second voltage is changed with a second signal 142 the strength of which has a different mathematical sign than in the process for reaching the first, second and third target tilt angle θs1, θs2, θs3.

Following receipt of a fifth tilt signal 5, the first and the second voltage U1, U2 are changed in order to reach a fifth tilt angle θs5 that is smaller than the fourth tilt angle θs4. The change of the first and the second voltage U1, U2 is carried out in the same way as the process for reaching the fourth target tilt angle θs4.

As discussed above, the method according to the invention is carried out on the basis of an optical component 100 the displacement device 200 of which is configured to tilt the mirror element 20 about a tilt axis 28, namely with a tilting degree of freedom. What is discussed in particular is carrying out the method according to the invention by way of a first electrode pair 202 in the first sector 32.

The articulation device 80 may also define a further tilt axis 28 that is aligned parallel to the common plane 70 and corresponds to the y-axis. The two tilt axes 28 defined by the articulation device 80 then correspond in each case to one of the tilting degrees of freedom. The two tilt axes 28 intersect at a central point, which is also referred to as tilt point of the mirror element 20. In this case, the common plane 70 is divided, by the two tilt axes 28, into four sectors 32, 34, also referred to as quadrant. A first active actuator electrode 421, a second active actuator electrode 441 and an active sensor electrode 521 may be arranged in each sector or quadrant. In this case, the first and the second actuator electrode structures and the sensor electrode structure 42, 44, 52 may each exhibit radial symmetry. In this case, the displacement device 200 of the optical component 100 is accordingly configured to tilt the mirror element 20 about two tilt axes 28. The first active actuator electrodes 421 and the second active actuator electrodes 441 of the opposing electrode pairs with respect to the tilt point may in this case be controlled differentially. The active sensor electrodes of the opposing electrode pairs with respect to the tilt point may in this case be connected differentially.

The invention is not limited to the exemplary embodiments described here and the aspects highlighted therein. On the contrary, a large number of modifications that are within the ability of a person skilled in the art are possible within the scope specified by the claims.

The invention claimed is:

1. A method for operating an optical component comprising a mirror element, a substrate for carrying the mirror element, an actuator device that is configured to tilt the mirror element about one or two tilt axes, wherein the actuator device has a first actuator electrode structure and a second actuator electrode structure, and a sensor device for detecting a tilt angle of the mirror element, wherein the first actuator electrode structure comprises:

a plurality of first active actuator electrodes and at least one first passive actuator electrode and wherein the second actuator electrode structure comprises:

a plurality of second active actuator electrodes and at least one second passive actuator electrode, characterized in that at least one of the first active actuator electrodes is subjected to a first voltage and at least one of the second active actuator electrodes is subjected to a second voltage, wherein, in order to tilt the mirror element, the first and the second voltage are changed with different rates of change.

2. The method according to claim 1, characterized in that the first voltage is changed with a first signal and the second voltage is changed with a second signal, wherein the first and the second signal have different time constants.

3. The method according to claim 2, characterized in that the first signal has a first signal gradient that is designed so as to avoid interference with sensor signals of the sensor device, and/or the second signal has a second signal gradient that is designed so as to compensate for position changes of the mirror element.

4. The method according to claim 3, characterized in that the first signal has a first signal gradient that is designed so as to avoid interference with sensor signals of the sensor device.

5. The method according to claim 3, characterized in that the second signal has a second signal gradient that is designed so as to compensate for position changes of the mirror element.

6. The method according to claim 3, characterized in that the first signal has a first signal gradient that is designed so as to avoid interference with sensor signals of the sensor device and the second signal has a second signal gradient that is designed so as to compensate for position changes of the mirror element.

7. The method according to claim 2, characterized in that the strength of the second signal for changing the second voltage adopts a constant value or is computed on the basis of a difference between a target tilt angle and a detected tilt angle.

8. The method according to claim 2, characterized in that the first signal is regulated such that the second signal, in a steady state of the first signal, is in an optimum operating state.

9. An optical component, comprising a mirror element, a substrate for carrying the mirror element, an actuator device that is configured to tilt the mirror element about one or two tilt axes, and a sensor device for detecting a tilt angle of the mirror element, characterized in that the optical component is configured to carry out a method according to claim 1.

10. A mirror array, comprising a plurality of optical components according to claim 9.

11. An illumination optical unit for a projection exposure apparatus for guiding illumination radiation to an object field, comprising at least one mirror array according to claim 10.

12. An illumination system for a projection exposure apparatus, comprising an illumination optical unit according to claim 11 and a radiation source.

13. A microlithographic projection exposure apparatus, comprising an illumination optical unit according to claim 11 and a projection optical unit for projecting a reticle arranged in an object field into an object field into an image field.

14. The method according to claim 1, characterized in that the plurality of first active actuator electrodes is attached to the substrate.

15. The method according to claim 14, characterized in that the plurality of second active actuator electrodes is attached to the substrate.

16. The method according to claim 1, characterized in that the at least one first passive actuator electrode is attached to the mirror element.

17. The method according to claim 16, characterized in that the at least one second passive actuator electrode is attached to the mirror element.

18. The method according to claim 1, characterized in that the plurality of first active actuator electrodes is attached to the substrate; and the at least one first passive actuator electrode is attached to the mirror element.

19. The method according to claim 1, characterized in that the plurality of second active actuator electrodes is attached to the substrate; and the at least one second passive actuator electrode is attached to the mirror element.

20. The method according to claim 1, characterized in that the plurality of first active actuator electrodes and the plurality of second active actuator electrodes are attached to the substrate; and the at least one first passive actuator electrode and the at least one second passive actuator electrode are attached to the mirror element.

* * * * *